(12) United States Patent
Huang (10) Patent No.: US 10,224,409 B2
(45) Date of Patent: Mar. 5, 2019

(54) THIN FILM TRANSISTOR, METHOD FOR PRODUCING THE SAME, ARRAY SUBSTRATE AND DISPLAY APPARATUS

(71) Applicant: BOE TECHNOLOGY GROUP CO., LTD., Beijing (CN)

(72) Inventor: Yongchao Huang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 7 days.

(21) Appl. No.: 15/326,399

(22) PCT Filed: Feb. 3, 2016

(86) PCT No.: PCT/CN2016/073297
§ 371 (c)(1),
(2) Date: Jan. 13, 2017

(87) PCT Pub. No.: WO2017/049835
PCT Pub. Date: Mar. 30, 2017

(65) Prior Publication Data
US 2017/0263726 A1 Sep. 14, 2017

(30) Foreign Application Priority Data
Sep. 23, 2015 (CN) .......................... 2015 1 0613414

(51) Int. Cl.
*H01L 27/01* (2006.01)
*H01L 29/49* (2006.01)
(Continued)

(52) U.S. Cl.
CPC ........ *H01L 29/4908* (2013.01); *G02F 1/1362* (2013.01); *G02F 1/1368* (2013.01);
(Continued)

(58) Field of Classification Search
CPC . H01L 29/66045; H01L 29/78; H01L 29/786; H01L 29/408; H01L 29/4908;
(Continued)

(56) References Cited

U.S. PATENT DOCUMENTS 8,629,427 B2 1/2014 Banerjee et al.
2012/0273763 A1 11/2012 Banerjee et al.
(Continued)

FOREIGN PATENT DOCUMENTS

CN 102270665 A 12/2011
CN 103038835 A 4/2013
(Continued)

OTHER PUBLICATIONS

International Search Report and Written Opinion (including English translation of Box V.) dated Jul. 1, 2016, for corresponding PCT Application No. PCT/CN2016/073297.
(Continued)

*Primary Examiner* — Kevin M Picardat
(74) *Attorney, Agent, or Firm* — Kinney & Lange, P.A.

(57) ABSTRACT

The present disclosure provides a thin film transistor, a method for producing the same, an array substrate and a display apparatus. An electrode of the thin film transistor is made of Cu or Cu alloy, and an anti-oxidization layer is used to prevent oxidization of Cu. The thin film transistor includes a gate electrode, a gate insulation layer, a semiconductor active layer, a source electrode and a drain electrode provided on a base substrate, wherein the gate electrode and/or the drain and source electrodes is/are made of Cu or Cu alloy. The thin film transistor further includes an anti-oxidization layer made of a topological insulator material, the anti-oxidization layer being provided above and in contact with the gate electrode and/or the source and drain electrodes made of Cu or Cu alloy.

17 Claims, 5 Drawing Sheets

(51) Int. Cl.
| | | |
|---|---|---|
| *G02F 1/1362* | (2006.01) | |
| *G02F 1/1343* | (2006.01) | |
| *G02F 1/1368* | (2006.01) | |
| *H01L 21/02* | (2006.01) | |
| *H01L 21/04* | (2006.01) | |
| *H01L 27/12* | (2006.01) | |
| *H01L 29/16* | (2006.01) | |
| *H01L 29/167* | (2006.01) | |
| *H01L 29/40* | (2006.01) | |
| *H01L 29/66* | (2006.01) | |
| *H01L 29/786* | (2006.01) | |
| *H01L 29/417* | (2006.01) | |
| *H01L 29/423* | (2006.01) | |
| *H01L 29/45* | (2006.01) | |
| *H01L 27/32* | (2006.01) | |
| *H01L 51/52* | (2006.01) | |

(52) U.S. Cl.
CPC .... *G02F 1/13439* (2013.01); *G02F 1/134309* (2013.01); *G02F 1/136286* (2013.01); *H01L 21/0259* (2013.01); *H01L 21/0262* (2013.01); *H01L 21/02527* (2013.01); *H01L 21/043* (2013.01); *H01L 21/044* (2013.01); *H01L 27/124* (2013.01); *H01L 29/1606* (2013.01); *H01L 29/167* (2013.01); *H01L 29/408* (2013.01); *H01L 29/41733* (2013.01); *H01L 29/42384* (2013.01); *H01L 29/45* (2013.01); *H01L 29/458* (2013.01); *H01L 29/66045* (2013.01); *H01L 29/78606* (2013.01); *H01L 29/78684* (2013.01); *G02F 2201/121* (2013.01); *G02F 2201/123* (2013.01); *G02F 2202/10* (2013.01); *H01L 27/3262* (2013.01); *H01L 51/5206* (2013.01)

(58) Field of Classification Search
CPC ............... H01L 29/167; H01L 29/1606; H01L 51/5206; H01L 27/124; H01L 27/3262; H01L 21/02527; H01L 21/0259; H01L 21/0262; H01L 21/043; H01L 21/04
See application file for complete search history.

(56) References Cited

U.S. PATENT DOCUMENTS

| | | | | |
|---|---|---|---|---|
| 2013/0153911 | A1* | 6/2013 | Zhang | G02F 1/13439 257/59 |
| 2015/0062475 | A1* | 3/2015 | Kim | H01L 29/78648 349/43 |
| 2015/0144944 | A1* | 5/2015 | Yang | H01L 27/124 257/43 |
| 2015/0213915 | A1 | 7/2015 | Back et al. | |
| 2016/0181278 | A1* | 6/2016 | Choi | H01L 29/458 257/72 |
| 2017/0040342 | A1* | 2/2017 | Ning | H01L 27/124 |

FOREIGN PATENT DOCUMENTS

| | | |
|---|---|---|
| CN | 103400859 A | 11/2013 |
| CN | 103429530 A | 12/2013 |
| CN | 103915451 A | 7/2014 |
| CN | 104078619 A | 10/2014 |
| CN | 104157698 A | 11/2014 |
| CN | 104701384 A | 6/2015 |
| CN | 104766803 A | 7/2015 |
| CN | 105070766 A | 11/2015 |
| CN | 204927297 A | 12/2015 |
| CN | 204927297 U | 12/2015 |

OTHER PUBLICATIONS

First Chinese Office Action, for Chinese Patent Application No. 201510613414.6, dated Aug. 31, 2017.
Extended European Search Report, for European Patent Application No. 16822102.6, dated Feb. 22, 2018, 8 pages.
Weng, Hongming et al., "Large-gap two-dimensional topological insulator in oxygen functionalized MXene", American Physical Society, dated Aug. 24, 2015, 7 pages.

* cited by examiner

THIN FILM TRANSISTOR, METHOD FOR PRODUCING THE SAME, ARRAY SUBSTRATE AND DISPLAY APPARATUS

CROSS-REFERENCE TO RELATED APPLICATION

This application is a Section 371 National Stage Application of International Application No. PCT/CN2016/073297, filed on Feb. 3, 2016, entitled "THIN FILM TRANSISTOR, METHOD FOR PRODUCING THE SAME, ARRAY SUBSTRATE AND DISPLAY APPARATUS", which has not yet published, and which claims priority to Chinese Patent Application No. 201510613414.6 filed on Sep. 23, 2015 and titled as "THIN FILM TRANSISTOR, METHOD FOR PRODUCING THE SAME, ARRAY SUBSTRATE AND DISPLAY APPARATUS", incorporated herein by reference in their entirety.

BACKGROUND OF THE DISCLOSURE

Field of the Disclosure

The present disclosure relates to the field of display technology, and in particular, to a thin film transistor, a method for producing the same, an array substrate and a display apparatus.

Description of the Related Art

Figure 1:
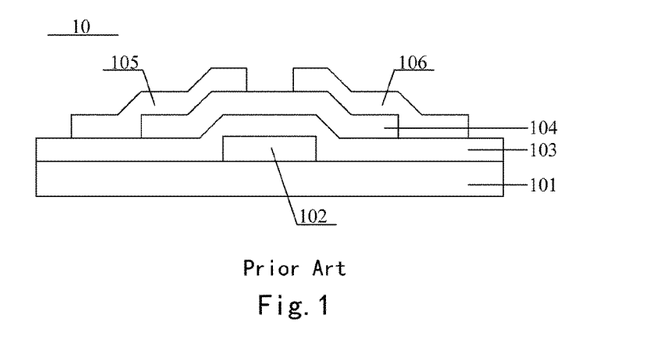
FIG. 1 is a schematic view for showing a structure of a thin film transistor in the prior art.

Nowadays, TFTs (Thin Film Transistors) have become one of the most widely used transistors. As shown in FIG. 1, the thin film transistor 10 includes a gate electrode 102, a gate insulation layer 103, a semiconductor active layer 104, a source electrode 105 and a drain electrode 106 provided on a base substrate 101.

In one example, the gate electrode 102, the source electrode 105 and the drain electrode 106 are normally made of metal materials having low electrical resistance, such as copper (Cu), Cu alloys, aluminum (Al), silver (Ag) or the like.

Since Ag is expensive, the use of Ag will lead to increasing of the cost of the TFTs. Thus Ag is less used as electrode materials of the TFTs.

Compared with Al, Cu and Cu alloys have better electrical conductivity. However, since Cu atoms are relatively active and tend to be oxidized, it is certain to consider oxidization of Cu caused during a producing process in a case that the Cu and Cu alloys are used as the electrode materials. Therefore, currently, it is often to use Al as the electrode material.

SUMMARY

Embodiments of the present disclosure provide a thin film transistor, a method for producing the thin film transistor, an array substrate, and a display apparatus, in which Cu or Cu alloy are used as an electrode material while they can prevent Cu oxidization.

In order to at least achieve parts of the above objectives, the embodiments of the present disclosure employ the following technical solutions.

In accordance with one aspect of the present disclosure, it provides a thin film transistor, comprising a gate electrode, a gate insulation layer, a semiconductor active layer, a source electrode and a drain electrode provided on a base substrate, wherein the gate electrode and/or the drain and source electrodes is/are made of Cu or Cu alloy;

the thin film transistor further comprises an anti-oxidization layer made of a topological insulator material, and the anti-oxidization layer is arranged above and in contact with the gate electrode and/or the source and drain electrodes made of Cu or Cu alloy.

In one example, both the gate electrode and the source and drain electrodes are made of Cu or Cu alloy, and the anti-oxidization layer comprises a first anti-oxidization layer provided above and in contact with the gate electrode, and a second anti-oxidization layer provided above and in contact with the source and drain electrodes.

In one example, the semiconductor active layer is an active layer of nitrogen doped graphene.

In one example, the gate insulation layer is a silicon nitride layer in contact with the active layer of nitrogen doped graphene;

the anti-oxidization layer comprises a first anti-oxidization layer provided above and in contact with the gate electrode, and the silicon nitride layer is in contact with the first anti-oxidization layer.

In one example, the gate insulation layer comprises a first silicon nitride layer in contact with the active layer of nitrogen doped graphene, a second silicon nitride layer and a silicon dioxide layer disposed between the first silicon nitride layer and the second silicon nitride layer;

the anti-oxidization layer comprises a first anti-oxidization layer provided above and in contact with the gate electrode, and the second silicon nitride layer is in contact with the first anti-oxidization layer.

In one example, in a direction perpendicular to the base substrate, a projection of the anti-oxidization layer onto the base substrate entirely covers that of the gate electrode and/or the source and drain electrodes made of Cu or Cu alloy onto the base substrate.

In one example, the topological insulator comprises at least one of HgTe quantum well, BiSb alloy, $Bi_2Se_3$, $Sb_2Te_3$ and $Bi_2Te_3$.

In accordance with another aspect of the present disclosure, it provides an array substrate, comprising the thin film transistor as described above.

In one example, the array substrate further comprises a pixel electrode or an anode connected with the drain electrode of the thin film transistor, and the pixel electrode or the anode is made of the topological insulator.

In one example, in a case that the array substrate comprises the pixel electrode, the array substrate further includes a common electrode, wherein the common electrode is made of ITO, IZO, or the topological insulator.

In one example, the array substrate further comprises a gate line connected with the gate electrode of the thin film transistor, a gate line lead connected with the gate line, a data line connected with the source electrode and a data line lead connected with the data line;

when the anti-oxidization layer made of the topological insulator material, is located above the gate electrode made of Cu or Cu alloy and is in contact with the gate electrode, the anti-oxidization layer is also provided above and in contact with the gate line and the gate line lead; and/or when the anti-oxidization layer made of the topological insulator material, is provided above the source and drain electrodes made of Cu or Cu alloy and is in contact with the source and drain electrodes made of Cu or Cu alloy, the anti-oxidization layer is also provided above and in contact with the data line and the data line lead.

In accordance with a further aspect of the present disclosure, it provides a display apparatus, comprising the array substrate as described above.

In accordance with a yet further aspect of the present disclosure, it provides a method for producing a thin film transistor, comprising forming a gate electrode, a gate insulation layer, a semiconductor active layer, a source electrode and a drain electrode on a base substrate, wherein the gate electrode and/or the source and drain electrodes is/are made of Cu or Cu alloy;

the method further comprises forming an anti-oxidization layer using a topological insulator material while the gate electrode and/or the source and drain electrodes are formed using Cu or Cu alloy, wherein the anti-oxidization layer is located above the gate electrode and/or the source and drain electrodes made by Cu or Cu alloy.

In one example, the step of forming the anti-oxidization layer using the topological insulator material comprises:

in a direction perpendicular to the base substrate, entirely covering a projection of the gate electrode and/or the source and drain electrodes onto the base substrate by a projection of the anti-oxidization layer onto the base substrate, the gate electrode and/or the source and drain electrodes being made of Cu or Cu alloy.

In one example, the step of forming the semiconductor active layer comprises:

forming an active layer of nitrogen doped graphene by a chemical vapor deposit (CVD) method under an atmosphere of $H_2$ and Ar with $NH_3$ and $CH_4$ being used as a reactive source.

BRIEF DESCRIPTION OF THE DRAWINGS

In order to explain technical solutions in the embodiments of the present disclosure or the prior art more explicitly, figures that are needed for illustrating the embodiments or the prior art are explained briefly below. Apparently, the following figures only show some of the embodiments of the present disclosure. It would be appreciated by the skilled person in the art that other figures may also be derived from these figures without any creative efforts.

DETAILED DESCRIPTION OF PREFERRED EMBODIMENTS OF THE DISCLOSURE

Technical solutions of embodiments of the present disclosure will be further explained clearly and entirely below with reference to the figures. Apparently, the described embodiments are only some of the embodiments of the present disclosure, instead of all of the embodiments of the present disclosure. All of other embodiments that may be derived from the embodiments of the present disclosure by one skilled in the art without paying any creative efforts will fall within protection scope of the present disclosure.

Technical terms or science terms used herein shall be understood by the skilled person in the art in their general sense, unless they are defined otherwise. In the present disclosure or pending claims of the present application, the expressions "first", "second" and the like are used to distinguish different integral components, rather than to indicate any sequence, number or importance. Terms "connection or "be connected to" and the like are not only limited to a physical connection or a mechanical connection, rather than comprising an electrical connection either directly or indirectly. The terms for indicating positional relationship such as "upper" and "lower" are meant to those as shown in the figures and are only for the sake of brief description.

Figure 2:
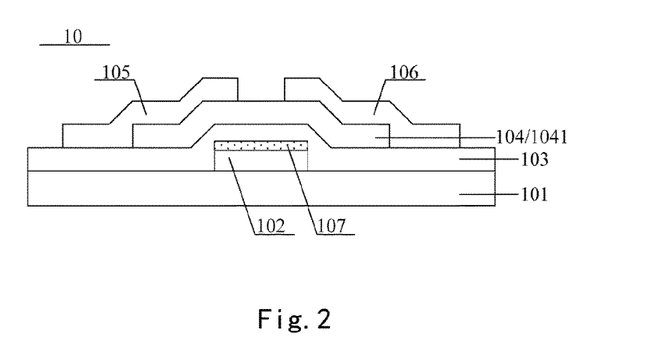
FIG. 2 is a schematic view for showing a structure of a first example of a thin film transistor in accordance with an embodiment of the present disclosure.
Figure 3:
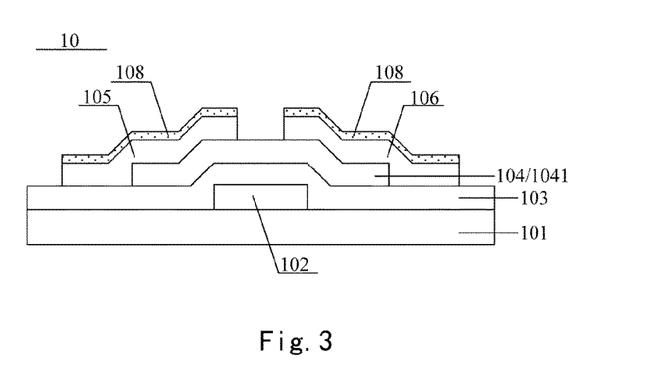
FIG. 3 is a schematic view for showing a structure of a second example of a thin film transistor in accordance with an embodiment of the present disclosure.
Figure 4:
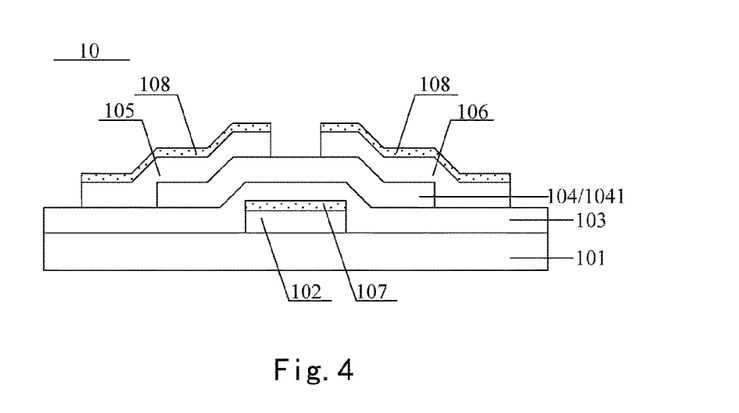
FIG. 4 is a schematic view for showing a structure of a third example of a thin film transistor in accordance with an embodiment of the present disclosure.

An embodiment of the present disclosure provides a thin film transistor 10, as shown in FIGS. 2-4. This thin film transistor 10 includes a gate electrode 102, a gate insulation layer 103, a semiconductor active layer 104, a source electrode 105 and a drain electrode 106 provided on a base substrate 101. The gate electrode 102 and/or the drain and source electrodes 105, 106 is/are made of Cu or Cu alloy. On this basis, the thin film transistor 10 further includes an anti-oxidization layer made of topological insulator material. The anti-oxidization layer is located above and in contact with the gate electrode 102 and/or the source and drain electrodes 105, 106 which is/are made of Cu or Cu alloy.

In one example, as shown in FIG. 2, the gate electrode 102 may be made of Cu or Cu alloy. The source and drain electrodes 105, 106 may be made of other conductive materials which are unlikely to be oxidized, such as Al.

On this basis, the anti-oxidization layer may include a first anti-oxidization layer 107 which is provided above the gate electrode 102 and is in contact with the gate electrode 102. Specifically, the first anti-oxidization layer 107 has a thickness of hundreds of angstroms (Å).

Alternatively, as shown in FIG. 3, the source electrode 105 and the drain electrode 106 can be made of Cu or Cu alloy, and the gate electrode 102 can be made of other materials which are unlikely to be oxidized, such as Al.

On this basis, the anti-oxidization layer may include a second anti-oxidization layer 108 which is provided above the source and drain electrodes 105, 106 and is in contact with them. Specifically, the second anti-oxidization layer 108 has a thickness of hundreds of angstroms (Å).

Alternatively, as shown in FIG. 4, the gate electrode 102 and the source and drain electrodes 105, 106 are made of Cu or Cu alloy.

On this basis, the anti-oxidization layer may include a first anti-oxidization layer 107 and a second anti-oxidization layer 108. The first anti-oxidization layer 107 is provided above the gate electrode 102 and is in contact with the gate electrode 102. The second anti-oxidization layer 108 is provided above the source and drain electrodes 105, 106 and is in contact with them. Specifically, the first anti-oxidization layer 107 and the second anti-oxidization layer 108 may have a same thickness of hundreds of angstroms (Å).

It should be noted that firstly the semiconductor active layer 104 may be made of amorphous silicon, metal oxides, organic semiconductor, grapheme or the like, but is not limited to these materials.

Secondly, according to the forming sequences of the semiconductor active layer 104 and the source and drain electrodes 105, 106, the thin film transistor 10 may be classified into an interlace type and a de-interlace type, or a coplanar type and a non-coplanar type. Of course, it may also be classified into a bottom gate type and a top gate type.

Thirdly, an energy band structure within a topological insulator is identical with that in an ordinary insulator, and both have an energy gap with a limited size at Fermi energy level. However, there are at a boundary or surface of the topological insulator Dirac electronic states that can go across the energy gap, so that there are always conducting edge states at its boundary or surface, existence of which is stable without being subject to effects of impurity and disorder. Therefore, the topological insulator has a high electron mobility and a good electrical conductivity.

In addition, the topological insulator also has a good heat conductivity, and thus can avoid degradation of performance of the thin film transistor caused by heat generation within the thin film transistor.

Fourthly, when being used as the electrode material, Cu or Cu alloy is likely to be oxidized. In order to solve this problem, the embodiments of the present disclosure provide a corresponding anti-oxidization layer. On this basis, the person skilled in the art shall understand that the it is better to provide the anti-oxidization layer above the electrodes made of Cu or Cu alloy and in contact with the electrodes, that is, the anti-oxidization layer is provided on one side of the electrode made of Cu or Cu alloy facing away the base substrate 101 and in contact with the electrode, and the projection of the anti-oxidization layer onto the base substrate 101 in a direction perpendicular to the base substrate 101 entirely covers that of the electrode made of Cu or Cu alloy onto the base substrate 101.

An embodiment of the present disclosure provides a thin film transistor 10, including a gate electrode 102, a gate insulation layer 103, a semiconductor active layer 104, a source electrode 105 and a drain electrode 106 provided on a base substrate 101. The gate electrode 102 and/or the drain and source electrodes 105, 106 are made of Cu or Cu alloy. On this basis, the thin film transistor 10 further includes an anti-oxidization layer made of topological insulator material. The anti-oxidization layer is provided above and in contact with the gate electrode 102 and/or the source and drain electrodes 105, 106 made of Cu or Cu alloy. On one hand, the electrode/electrodes of the thin film transistor 10 made of Cu or Cu alloy has/have a good electrical conductivity and a less power consumption, so that the performance of the thin film transistor 10 is improved; on the other hand, since the topological insulator per se is stable in structure and unlikely to be oxidized, the anti-oxidization layer made of the topological insulator material can protect the electrode/electrodes made of Cu or Cu alloy during respective manufacturing procedures of the thin film transistor, thereby preventing Cu from being oxidized. On this basis, because of the good electrical conductivity of the topological insulator, there is a little electrical resistance between the topological insulator and the electrode/electrodes made of Cu or Cu alloy, so as to prevent the performance of the thin film transistor 10 from being adversely affected. Furthermore, since the topological insulator has good heat conductivity, the topological insulator can prevent degradation of the performance of the thin film transistor caused by heat generation in the thin film transistor 10.

As compared with the case that only the gate electrode 102 or the source and drain electrodes 105, 106 is/are made of Cu or Cu alloy, it is preferable to make the thin film transistor 10 of Cu or Cu alloy in the embodiment of the present disclosure, so that the performance of the thin film transistor 10 may be further improved.

In one example, as shown in FIGS. 2-4, the semiconductor active layer 104 is an active layer 1041 of nitrogen doped grapheme, i.e., the material of the semiconductor active layer 104 is nitrogen doped graphene.

The electron energy band structure of the graphene can be changed by controlling contents of nitrogen in the graphene, so that the graphene is transformed from a conductor to a semiconductor while original physical performance of the graphene, i.e., high electron mobility, good head conductivity and stable structure, are substantially retained.

In the embodiment of the present disclosure, a better electron mobility can be achieved by forming the semiconductor active layer 104 by the nitrogen doped graphene, and when such thin film transistor 10 is applied into a display apparatus, a charging rate and a discharging rate of the electrodes connected with the thin film transistor 10 can be improved, thereby increasing a pixel response speed and obtaining a more fast refresh rate. Therefore, the thin film transistor according to the embodiment of the present disclosure can be applied into a display apparatus having an ultra-high resolution. In addition, because the semiconductor active layer 104 is made of nitrogen doped graphene, it becomes relatively stable in terms of structure, and is beneficial to stability of the thin film transistor 10.

In a further example, the gate insulation layer 103 includes a silicon nitride layer in contact with the active layer of nitrogen doped graphene 1041. On this basis, when the first anti-oxidization layer 107 is provided above and in contact with the gate electrode 102, the silicon nitride layer in the gate insulation layer 103 is in contact with the first anti-oxidization layer 107.

Figure 5A:
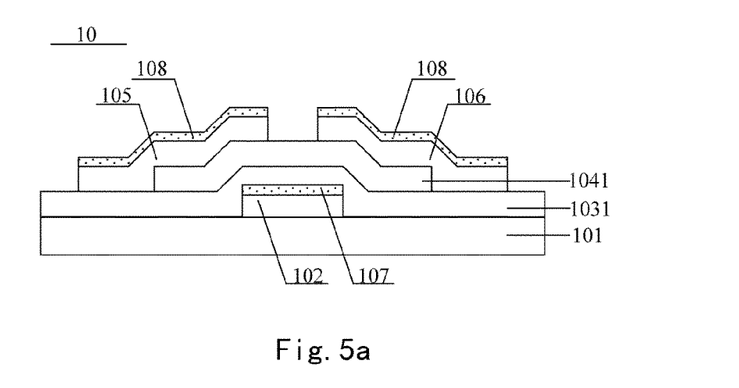
FIG. 5a is a schematic view for showing a structure of a fourth example of a thin film transistor in accordance with an embodiment of the present disclosure.

Specifically, as shown in FIG. 5a, the gate insulation layer 103 may only include a silicon nitride layer 1031, which is not only in contact with the active layer of nitrogen doped grapheme 1041, but also in contact with the first anti-oxidization layer 107.

Figure 5B:
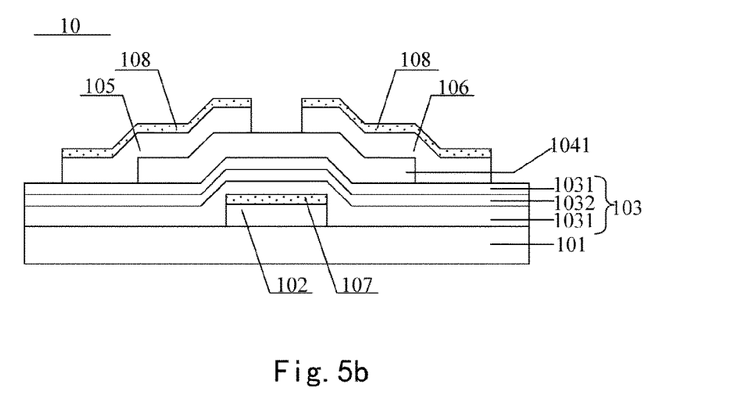
FIG. 5b is a schematic view for showing a structure of a fifth example of a thin film transistor in accordance with an embodiment of the present disclosure.

Alternatively, as shown in FIG. 5b, the gate insulation layer 103 may include two layers of silicon nitride 1031 and a silicon dioxide layer 1032 disposed between the two layers of silicon nitride 1031. The two layers of silicon nitride 1031 are in contact with the active layer of nitrogen doped graphene 1041 and the first anti-oxidization layer 107, respectively.

Since the silicon nitride layer 1031 contains nitrogen atoms, when the active layer of nitrogen doped graphene 1041 is formed above it, the silicon nitride layer 1031 can provide the nitrogen atoms to the active layer of nitrogen doped grapheme 1041 and be in better contact with the active layer of nitrogen doped grapheme 1041.

In addition, the silicon dioxide layer 1032 contains oxygen atoms whereas the silicon nitride layer 1031 does not contain oxygen atoms. When the silicon nitride layer 1031 is in contact with the first anti-oxidation layer 107, oxidization of the gate electrode 102, made of Cu or Cu alloy, by oxygen can be avoided.

As described above, the topological insulator may include at least one of HgTe quantum well, BiSb alloy, $Bi_2Se_3$, $Sb_2Te_3$ and $Bi_2Te_3$.

In one example, since it is easy to synthesize $Bi_2Se_3$ and $Bi_2Se_3$ is stable in terms of chemical structure, it is preferable to use $Bi_2Se_3$ as the topological insulators of the present embodiment.

Another embodiment of the present disclosure also provides an array substrate including the thin film transistor as described above.

Figure 6:
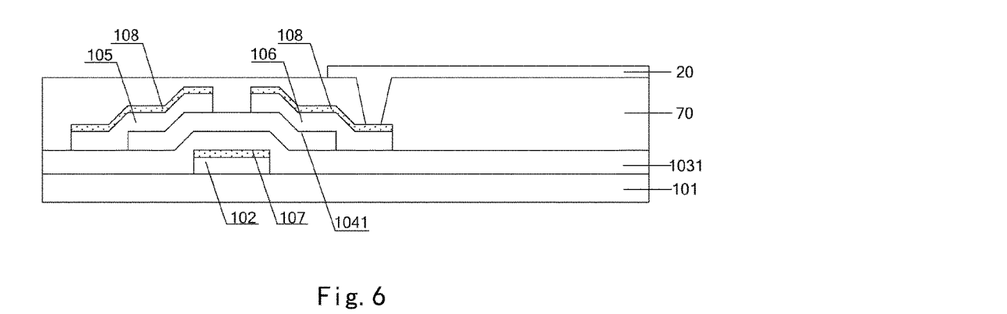
FIG. 6 is a schematic view for showing a structure of a first example of an array substrate, applied in a liquid crystal display apparatus, in accordance with an embodiment of the present disclosure.
Figure 7:
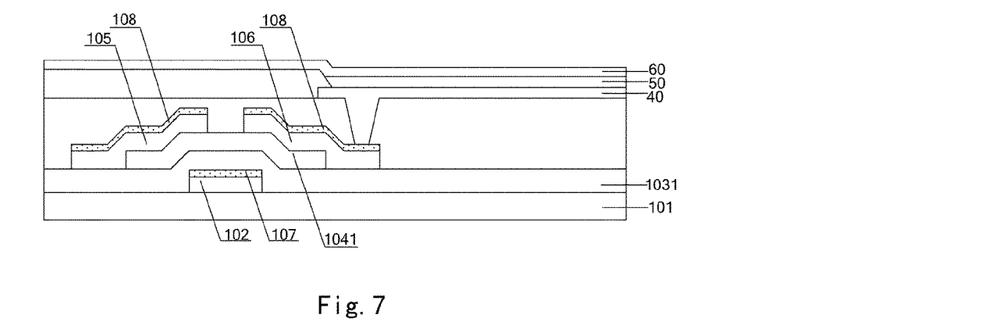
FIG. 7 is a schematic view for showing a structure of an array substrate, applied in an organic light emitting diode display apparatus, in accordance with an embodiment of the present disclosure.

Optionally, as shown in FIGS. 6 and 7, the array substrate further includes a pixel electrode 20 or an anode 40 connected with the drain electrode 106 of the thin film transistor 10.

The pixel electrode 20 or the anode 40 may be connected with the drain electrode 106 of the thin film transistor 10 through a via hole of a protection layer 70 between the pixel electrode 20 or the anode 40 and the thin film transistor 10. The protection layer 70 may be made of at least one of SiON, $SiO_2$, SiNx and SiO. In consideration of an interface problem of the topological insulator of the second anti-oxidation layer 108, SiNx or SiON is preferably used in one example.

Since the topological insulator has not only a good electrical conductivity, but also a structure having stable properties, and a surface state of the topological insulator is a metal state, its topological property would not be changed even if film has defects in quality, so that its electrical conductivity will hardly be affected. Therefore, in one example, the pixel electrode 20 or the anode 40 is made of the topological insulator.

It should be noted that as shown in FIG. 7, in a case that the array substrate further includes the anode 40, the array substrate would also include an organic material function layer 50 and a cathode 60.

The organic material function layer 50 at least includes a light emitting layer. On this basis, in order to improve efficiency of electrons and electron holes injecting into the light emitting layer, the organic material function layer 50 further includes an electron transmission layer and an electron hole transmission layer. Further, the organic material function layer 50 may include an electron injection layer between the cathode 60 and the electron transmission layer and an electron hole injection layer between the electron hole transmission layer and the anode 40.

The cathode 60 may be opaque, i.e., be made of metal material and thick in thickness. In this case, as light from the organic material function layer 50 only exits from a side where the anode 40 is located, the display apparatus, to which the array substrate is applied, is of bottom light-emitting type.

The cathode 60 may be translucent, i.e., be made of metal material but thin in thickness. In such case, because the light from the organic material function layer 50 can exit not only from the side where the anode 40 is located, but also from a side where the cathode 60 is located, the display apparatus provided with such array substrate is of double-side light-emitting type.

Figure 8:
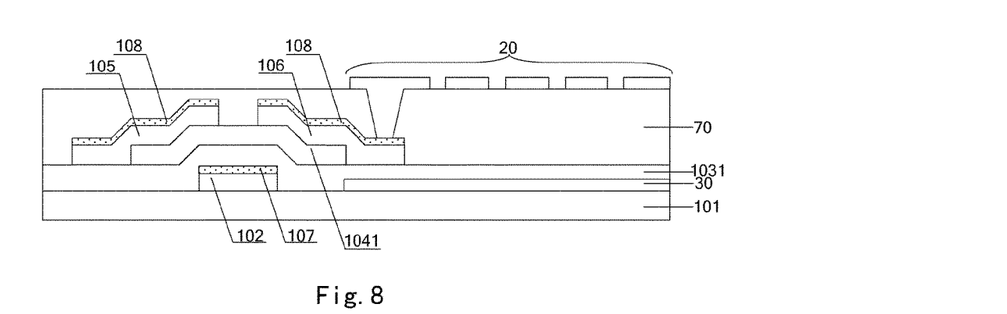
FIG. 8 is a schematic view for showing a structure of a second example of an array substrate, applied in a liquid crystal display apparatus, in accordance with an embodiment of the present disclosure.

Further, as shown in FIG. 8, in a case that the array substrate includes the pixel electrode 20, the array substrate also includes a common electrode 30. The common electrode 30 may be made of materials such as ITO, IZO, or the topological insulator.

ADS (Advanced Super Dimensional Switching) technique can improve picture quality of a product and bring advantages such as high resolution, high transmittivity, low power consumption, wide view angle, high aperture opening ratio, low chromatic aberration, no Push Mura or the like. Therefore, in the embodiment of the present disclosure, as shown in FIG. 8, optionally the pixel electrode 20 and the common electrode 30 are provided in different layers, and the upper electrode with respect to the base substrate 101 (for example the pixel electrode 20) is in a strip-like shape and the lower electrode with respect to the base substrate 101 (for example the common electrode 30) is in a plate-like shape.

Further, since the topological insulator has not only a good electrical conductivity, but also a structure having stable properties, and a surface state of the topological insulator is a metal state, its topological property would not be changed even if a film has defects in quality, so that its electrical conductivity will hardly be affected. Therefore, in one example, the common electrode 30 is preferably made of the topological insulator.

Figure 9A:
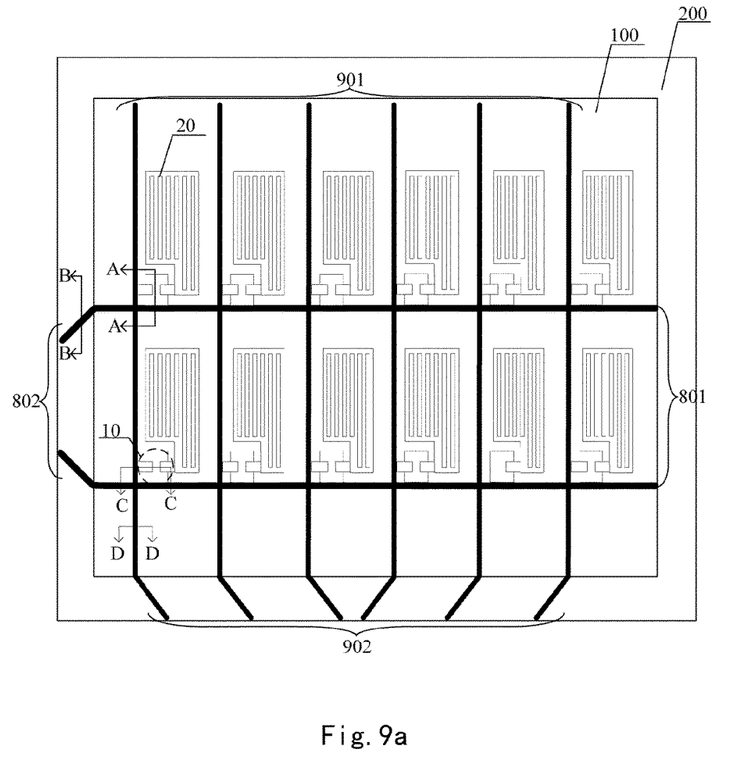
FIG. 9a is a schematic top view of an array substrate in accordance with an embodiment of the present disclosure.

Based on the above description, as shown in FIG. 9a, the array substrate further includes a gate line 801 connected with the gate electrode 102 of the thin film transistor 10, a gate line lead 802 connected with the gate line 801, a data line 901 connected with the source electrode 105 and a data line lead 902 connected with the data line 901. The gate line 801 and the data line 901 are located in a display region 100 of the array substrate and the gate line lead 802 and the date line lead 902 are located in a wiring region 200 of the array substrate.

It should be noted that the person skilled in the art shall understand that the display region 100 is used for displaying images and the wiring region 200 is located at a periphery of the display region 100 and used for wiring. The above described thin film transistor 10, the pixel electrode 20, the common electrode 30, the anode 40, the organic material function layer 50, the cathode 60 and son on all are located in the display region 100.

Figure 9B:
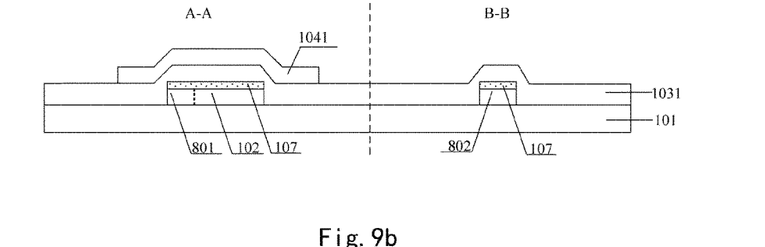
FIG. 9b is a schematic view in cross-section of the array substrate of FIG. 9a cut along lines A-A and B-B.

On this basis, as shown in FIG. 9b, in one example, in a case that the anti-oxidization layer is made of the topological insulator material, i.e., the first anti-oxidization layer 107 is located above the gate electrode 102 made of Cu or Cu alloy and is in contact with the gate electrode 102, the first anti-oxidization layer 107 is also provided above and in contact with the gate line 801 and the gate line lead 802.

In a case that the gate electrode 102 is made of Cu or Cu alloy, the gate line 801 and the gate line lead 802 are simultaneously formed while the gate electrode 102 is formed, and therefore the gate line 801 and the gate line lead 802 are also made of Cu or Cu alloy.

Figure 9C:
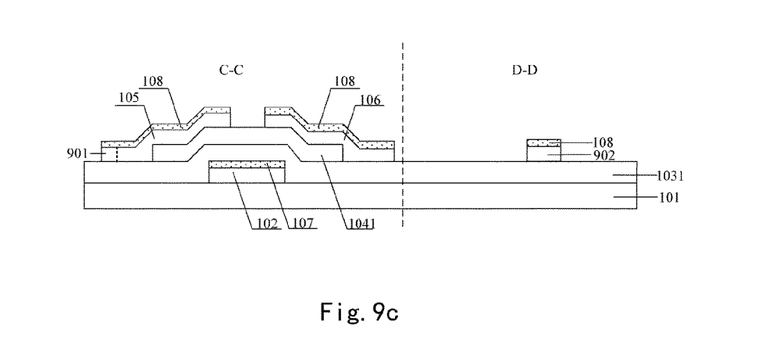
FIG. 9c is a schematic view in cross-section of the array substrate of FIG. 9a cut along lines C-C and D-D.

Alternatively/additionally, as shown in FIG. 9c, when the anti-oxidization layer is made of the topological insulator material, i.e., the second anti-oxidization layer 108 is provided above and in contact with the source and drain electrodes 105, 106 made of Cu or Cu alloy, the second anti-oxidization layer 108 is also provided above and in contact with the data line 901 and the data line lead 902.

When the drain electrode 106 is made of Cu or Cu alloy, the data line 901 and the data line lead 902 are normally formed while the drain electrode 106 is formed, and therefore the data line 901 and the data line lead 902 are also made of Cu or Cu alloy.

It should be noted that whether it is the first anti-oxidization layer 107 or the second anti-oxidization layer 108, its projection in the direction perpendicular to the base substrate 101 shall entirely cover the electrode that is made of Cu or Cu alloy, is provided below it and is in contact with it.

A further embodiment of the present disclosure provides a display apparatus including the array substrate as described above.

In a case that the array substrate includes the pixel electrode 20, the display apparatus further includes another substrate assembled with the array substrate. That is, the display apparatus is a liquid crystal display apparatus.

In a case that the array substrate includes the anode 40, the organic material function layer 50 and the cathode 60, the display apparatus further includes a packaging substrate. That is, the display apparatus is an organic light-emitting diode display apparatus.

The above display apparatus may be any product or component that can provide a display function, such as a liquid crystal display, an OLED display, a liquid crystal TV, an OLED TV, a digital photo frame, a cellphone, a panel computer, and the like.

A yet further embodiment of the present disclosure also provides a method for producing the thin film transistor. With reference to FIGS. 2-4, the method includes forming a gate electrode 102, a gate insulation layer 103, a semiconductor active layer 104, a source electrode 105 and a drain electrode 106 on a base substrate 101, wherein the gate electrode 102 and/or the source and drain electrodes 105, 106 is/are made of Cu or Cu alloy. The method further includes forming an anti-oxidization layer using a topological insulator material while the gate electrode and/or the source and drain electrodes is/are formed using Cu or Cu alloy, wherein the anti-oxidization layer is located above the gate electrode and/or the source and drain electrodes made by Cu or Cu alloy.

Specifically, with reference to FIG. 2, the gate electrode 102 may be made of Cu or Cu alloy. The source and drain electrodes 105, 106 may be formed by other conductive materials that is unlikely to be oxidized, for example Al.

On this basis, the anti-oxidization layer may include a first anti-oxidization layer 107, which is provided above the gate electrode 102 and is in contact with the gate electrode 102.

Alternatively, as shown in FIG. 3, the source and drain electrodes 105, 106 may be formed by Cu or Cu alloy, and the gate electrode 102 may be formed by other materials that are unlikely to be oxidized, for example Al.

On this basis, the anti-oxidization layer may include a second anti-oxidization layer 108, which is provided above the source and drain electrodes 105, 106 and is in contact with them.

Alternatively, as shown in FIG. 4, the gate electrode 102 and the source and drain electrodes 105, 106 are formed by Cu or Cu alloy.

On this basis, the anti-oxidization layer may include a first anti-oxidization layer 107 and a second anti-oxidization layer 108. The first anti-oxidization layer 107 is provided above the gate electrode 102 and is in contact with the gate electrode 102. The second anti-oxidization layer 108 is provided above the source and drain electrodes 105, 106 and is in contact with them.

With the method for producing the thin film transistor in accordance with the yet further embodiment of the present disclosure, on one hand, the electrode/electrodes of the thin film transistor 10 is/are made of Cu or Cu alloy, and has/have a good electrical conductivity and less power consumption, so that the performance of the thin film transistor 10 may be improved; on the other hand, since the topological insulator per se is stable in structure and is unlikely to be oxidized, the anti-oxidization layer made of the topological insulator material can protect the electrode/electrodes made of Cu or Cu alloy during respective manufacturing procedures of the thin film transistor, thereby preventing Cu from being oxidized. On this basis, because of good electrical conductivity of the topological insulator, there is a little electrical resistance between the topological insulator and the electrode/electrodes made of Cu or Cu alloy, so as to prevent the performance of the thin film transistor 10 from being affected. Since the topological insulator has good heat conductivity, the topological insulator can prevent degradation of the performance of the thin film transistor caused by heat generation in the thin film transistor 10. Furthermore, since the anti-oxidization layer and the electrode/electrodes made of Cu or Cu alloy below the electrode/electrodes are formed simultaneously, the number of patterning processes will not be increased.

Optionally, the step of forming the anti-oxidization layer includes: forming a topological insulator film by PECVD (Plasma Enhanced Chemical Vapor Deposition) or a sputtering method, and forming the corresponding anti-oxidization layer by a patterning process, for example the first and/or second anti-oxidization layer(s) 107, 108.

Optionally, the step of forming the semiconductor active layer 104 includes forming an active layer of nitrogen doped graphene 1041 by a CVD method under an atmosphere of $H_2$ and Ar with $NH_3$ and $CH_4$ being used as a reactive source.

In addition, $H_2$ may be used as a gas in the reactive atmosphere, so as to ensure formation of H element in alkene.

Concerning the above, the above embodiments are only given by way of examples, instead of limiting the protection scope of present application. It would be appreciated that various changes or alternations that can be envisaged easily by the skilled person in the art without departing from the scope of the disclosure will also fall within the protection scope of the present application. Therefore, the protection scope of the present application will be defined by the appended claims.

What is claimed is:

1. A thin film transistor, comprising a gate electrode, a gate insulation layer, a semiconductor active layer, a source electrode and a drain electrode provided on a base substrate, wherein the gate electrode and/or the drain and source electrodes is/are made of Cu or Cu alloy;
    wherein the thin film transistor further comprises an anti-oxidization layer made of a topological insulator material, the anti-oxidization layer being provided above and in contact with the gate electrode and/or the source and drain electrodes made of Cu or Cu alloy;
    wherein the semiconductor active layer is an active layer of nitrogen doped graphene,
    wherein the gate insulation layer is a silicon nitride layer in contact with the active layer of nitrogen doped graphene;
    wherein the anti-oxidization layer comprises a first anti-oxidization layer provided above and in contact with the gate electrode; and
    wherein the silicon nitride layer is in contact with the first anti-oxidization layer.

2. The thin film transistor according to claim 1, wherein:
    the gate electrode and the source and drain electrode are made of Cu or Cu alloy; and
    the anti-oxidization layer comprises a first anti-oxidization layer provided above and in contact with the gate electrode, and a second anti-oxidization layer provided above and in contact with the source and drain electrodes.

3. A thin film transistor, comprising a gate electrode, a gate insulation layer, a semiconductor active layer, a source electrode and a drain electrode provided on a base substrate, wherein the gate electrode and/or the drain and source electrodes is/are made of Cu or Cu alloy;
  wherein the thin film transistor further comprises an anti-oxidization layer made of a topological insulator material, the anti-oxidization layer being provided above and in contact with the gate electrode and/or the source and drain electrodes made of Cu or Cu alloy;
  wherein the semiconductor active layer is an active layer of nitrogen doped graphene;
  wherein the gate insulation layer comprises a first silicon nitride layer in contact with the active layer of nitrogen doped graphene, a second silicon nitride layer and a silicon dioxide layer between the first silicon nitride layer and the second silicon nitride layer;
  wherein the anti-oxidization layer comprises a first anti-oxidization layer provided above and in contact with the gate electrode; and
  wherein the second silicon nitride layer is in contact with the first anti-oxidization layer.

4. The thin film transistor according to claim 1, wherein in a direction perpendicular to the base substrate, a projection of the anti-oxidization layer onto the base substrate entirely covers that of the gate electrode and/or the source and drain electrodes made of Cu or Cu alloy onto the base substrate.

5. The thin film transistor according to claim 4, wherein the topological insulator comprises at least one of HgTe quantum well, BiSb alloy, $Bi_2Se_3$, $Sb_2Te_3$ and $Bi_2Te_3$.

6. An array substrate, comprising the thin film transistor according to claim 1.

7. The array substrate according to claim 6, wherein the array substrate further comprises a pixel electrode or an anode connected with the drain electrode of the thin film transistor; the pixel electrode or the anode being made of the topological insulator.

8. The array substrate according to claim 7, wherein the array substrate comprises the pixel electrode, and the array substrate further comprises a common electrode, wherein the common electrode is made of ITO, IZO, or the topological insulator.

9. The array substrate according to claim 6, wherein the array substrate further comprises a gate line connected with the gate electrode of the thin film transistor, a gate line lead connected with the gate line, a data line connected with the source electrode and a data line lead connected with the data line;
  when the anti-oxidization layer made of the topological insulator material is provided above the gate electrode made of Cu or Cu alloy and is in contact with the gate electrode, the anti-oxidization layer is also provided above and in contact with the gate line and the gate line lead; and/or
  when the anti-oxidization layer made of the topological insulator material is provided above and in contact with the source and drain electrodes made of Cu or Cu alloy, the anti-oxidization layer is also provided above and in contact with the data line and the data line lead.

10. A display apparatus, comprising the array substrate according to claim 6.

11. A method for producing the thin film transistor according to claim 1,
  the method further comprising forming an anti-oxidization layer using a topological insulator material while the gate electrode and/or the source and drain electrodes is/are formed using Cu or Cu alloy, wherein the anti-oxidization layer is provided above the gate electrode and/or the source and drain electrodes made of Cu or Cu alloy.

12. The method according to claim 11, wherein the step of forming the anti-oxidization layer using the topological insulator material comprises:
  in a direction perpendicular to the base substrate, entirely covering a projection of the gate electrode and/or the source and drain electrodes made of Cu or Cu alloy onto the base substrate by a projection of the anti-oxidization layer onto the base substrate.

13. The method according to claim 11, wherein the step of forming the semiconductor active layer comprises:
  forming an active layer of nitrogen doped graphene by a CVD method under an atmosphere of $H_2$ and Ar with $NH_3$ and $CH_4$ being used as a reactive source.

14. The thin film transistor according claim 3, wherein in a direction perpendicular to the base substrate, a projection of the anti-oxidization layer onto the base substrate entirely covers that of the gate electrode and/or the source and drain electrodes made of Cu or Cu alloy onto the base substrate.

15. The display apparatus according to claim 10, wherein the array substrate further comprises a pixel electrode or an anode connected with the drain electrode of the thin film transistor;
  the pixel electrode or the anode being made of the topological insulator.

16. The display apparatus according to claim 10, wherein the array substrate further comprises a gate line connected with the gate electrode of the thin film transistor, a gate line lead connected with the gate line, a data line connected with the source electrode and a data line lead connected with the data line, and wherein:
  the anti-oxidization layer made of the topological insulator material is provided above the gate electrode made of Cu or Cu alloy and is in contact with the gate electrode, and the anti-oxidization layer is also provided above and in contact with the gate line and the gate line lead; and/or
  the anti-oxidization layer made of the topological insulator material is provided above and in contact with the source and drain electrodes made of Cu or Cu alloy, and the anti-oxidization layer is also provided above and in contact with the data line and the data line lead.

17. The method according to claim 12, wherein the step of forming the semiconductor active layer comprises:
  forming an active layer of nitrogen doped graphene by a CVD method under an atmosphere of H2 and Ar with NH3 and CH4 being used as a reactive source.

* * * * *